US010720956B2

(12) United States Patent
Callender et al.

(10) Patent No.: US 10,720,956 B2
(45) Date of Patent: Jul. 21, 2020

(54) LOW LOSS TRANSMITTER RECEIVER SWITCH WITH TRANSFORMER MATCHING NETWORK

(71) Applicant: Intel Corporation, Santa Clara, CA (US)

(72) Inventors: Steven Callender, Portland, OR (US); Christopher Hull, Portland, OR (US); Stefano Pellerano, Beaverton, OR (US); Woorim Shin, Portland, OR (US); Ka Chun Kwok, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/123,434

(22) Filed: Sep. 6, 2018

(65) Prior Publication Data
US 2020/0083924 A1    Mar. 12, 2020

(51) Int. Cl.
*H04B 1/40* (2015.01)
*H04B 1/48* (2006.01)
(Continued)

(52) U.S. Cl.
CPC .............. *H04B 1/48* (2013.01); *H03F 1/565* (2013.01); *H03F 3/21* (2013.01); *H03H 7/38* (2013.01);
(Continued)

(58) Field of Classification Search
CPC .. H04B 1/48; H03F 1/565; H03F 3/21; H03H 7/38
See application file for complete search history.

(56) References Cited

U.S. PATENT DOCUMENTS 5,587,574 A * 12/1996 Van Geel ................. G06K 5/00
                                                      235/380
6,757,523 B2 * 6/2004 Fry ........................... H04B 1/48
                                                      333/103
(Continued)

FOREIGN PATENT DOCUMENTS

JP        2011010137 A      1/2011

OTHER PUBLICATIONS

Kuo, Chi-Shin et al. "A High-Isolation 60GHz CMOS Transmit/Receive Switch." IEEE. 2011. 4 pages.
(Continued)

*Primary Examiner* — Md K Talukder
(74) *Attorney, Agent, or Firm* — 2SPL Patent Attorneys

(57) ABSTRACT

A transmit receive switch (TRSW) system is disclosed. The system has a transmission line, a transformer based matching network, a shunt switch, an amplifier and circuitry. The transmission line is connected to an antenna port. The transformer based matching network is connected to the transmission line and has a first coil and a second coil, wherein the second coil is connected to the transmission line. The amplifier can be configured as a shunt switch when inactive. The shunt switch, including the amplifier configured as the shunt switch, can be connected to the first coil of the transformer based matching network. The circuitry is configured to cause the shunt switch to be ON during an inactive mode and create a short across the first coil. Combined, the length of transmission line needed to complete the impedance transformation is reduced, thereby lowering the overall insertion loss of the transmit/receive switch.

14 Claims, 13 Drawing Sheets

(51) Int. Cl.
*H03F 1/56* (2006.01)
*H03F 3/21* (2006.01)
*H03H 7/38* (2006.01)

(52) U.S. Cl.
CPC .. *H03F 2200/294* (2013.01); *H03F 2200/387* (2013.01)

(56) References Cited

U.S. PATENT DOCUMENTS

| | | | | |
|---|---|---|---|---|
| 7,283,793 | B1* | 10/2007 | McKay | H04B 1/0458 333/103 |
| 7,362,003 | B2* | 4/2008 | Stewart | F03B 13/1845 290/42 |
| 7,468,638 | B1* | 12/2008 | Tsai | H04B 1/48 331/126 |
| 8,736,511 | B2* | 5/2014 | Morris, III | H03F 1/565 343/860 |
| 10,103,696 | B1* | 10/2018 | Mitzlaff | H01L 21/8258 |
| 2002/0006810 | A1* | 1/2002 | Schiller | H01Q 21/30 455/552.1 |
| 2004/0100341 | A1* | 5/2004 | Luetzelschwab | H03F 1/56 333/32 |
| 2005/0110594 | A1* | 5/2005 | Culliton | H01P 5/12 333/125 |
| 2005/0218728 | A1* | 10/2005 | Stewart | F03B 13/1845 310/12.12 |
| 2005/0230206 | A1* | 10/2005 | Stewart | B60L 7/003 188/381 |
| 2007/0232241 | A1* | 10/2007 | Carley | H04B 1/44 455/83 |
| 2011/0010137 | A1* | 1/2011 | Yeh | G06F 30/23 703/2 |
| 2013/0005275 | A1 | 1/2013 | Nicolson | |
| 2014/0361628 | A1* | 12/2014 | Huang | H01F 38/14 307/104 |
| 2017/0019071 | A1* | 1/2017 | Kobayashi | H03F 1/56 |
| 2017/0250728 | A1* | 8/2017 | Afsahi | H04B 1/44 |
| 2018/0054776 | A1* | 2/2018 | Milham | H04W 76/11 |
| 2018/0083344 | A1* | 3/2018 | Han | H01Q 9/42 |
| 2019/0006885 | A1* | 1/2019 | Danilovic | H02J 50/60 |

OTHER PUBLICATIONS

Uzunkol, Mehmet et al. "A Low-Loss 50-70 GHz SPDT Switch in 90 nm CMOS." IEEE Journal of Solid-State Circuits, vol. 45, No. 10, Oct. 2010. 5 pages.
International Search Report and Written Opinion dated Nov. 7, 2019 in connection with PCT/US2019/043176.

* cited by examiner

LOW LOSS TRANSMITTER RECEIVER SWITCH WITH TRANSFORMER MATCHING NETWORK

FIELD

Various embodiments generally relate to the field of wireless communications.

BACKGROUND

Transceivers can share a single antenna or an antenna array for transmitting and receiving. By sharing the antenna or the antenna array, less hardware, inputs, outputs, and the like can be used.

However, higher insertion loss is typically caused by sharing the antenna. The higher insertion loss causes higher noise in the receiver and lower output power from the transmitter. Additionally, power consumption will increase to overcome the higher noise and lower output power.

What are needed are techniques to reduce the insertion loss of the transmit/receive switch and facilitate transceiver operation.

DETAILED DESCRIPTION

Figure 1:
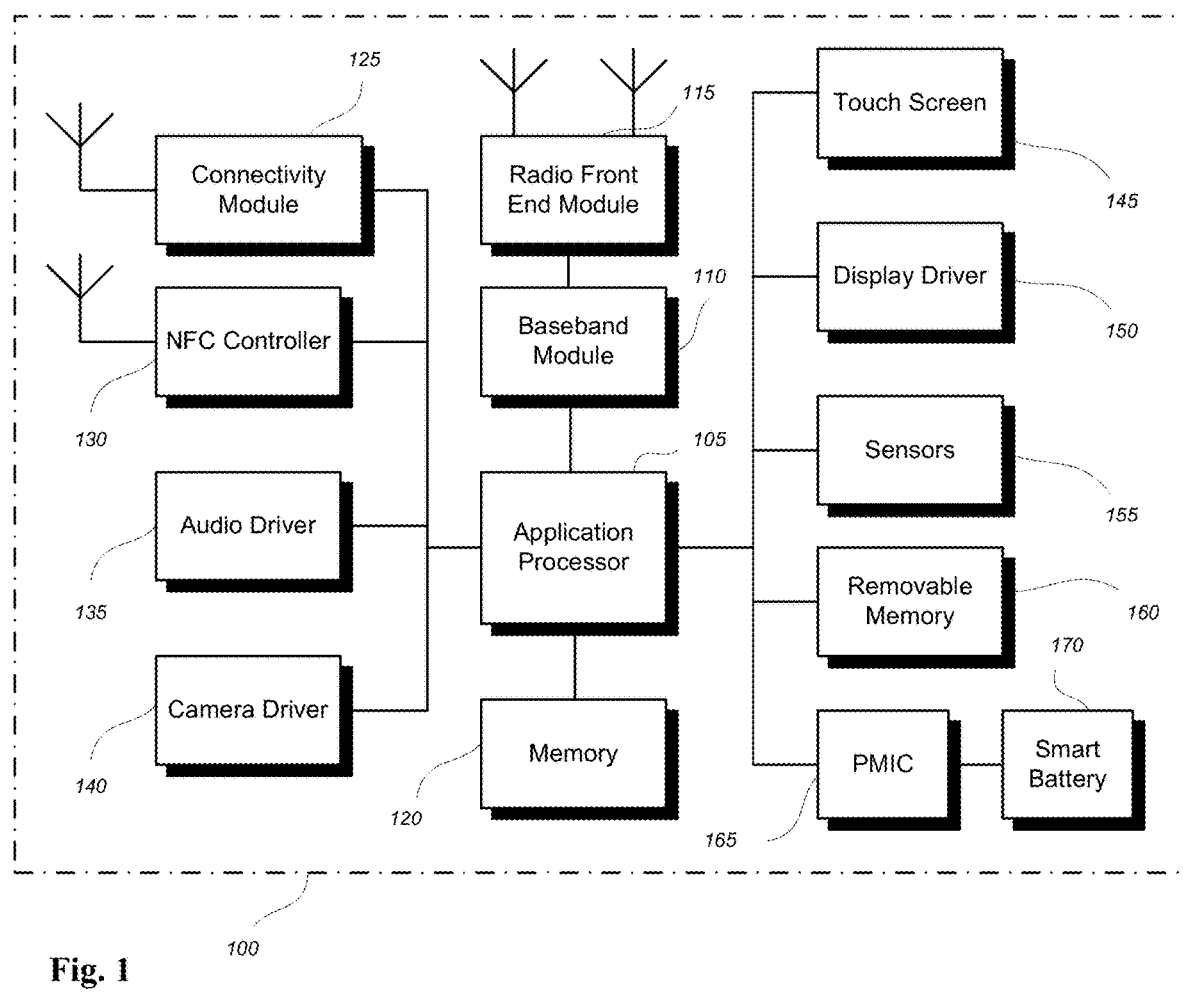
FIG. 1 illustrates an exemplary user device in accordance with an aspect.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Embodiments herein may be related to RAN1 and 5G.

As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

It is appreciated that integrated transceivers typically share a single antenna port for both a transmitter and receiver. This has the benefit of reducing the number of required radio frequency (RF) input/outputs (I/Os), simplifying package routing, mitigating external components (like switches) and the like, which can reduce cost and form factor.

To permit the transmitter and receiver to use the single antenna port, a transmitter/receiver switch (TRSW) can be used to interface the antenna port with front end circuitry. Generally, insertion loss of the TRSW should be mitigated because such loss in the TRSW degrades the noise figure of the receiver and the final transmitted power of the transmitter. The degraded noise and power diminishes a range over which a communication system can communicate.

It is also appreciated that higher TRSW losses increase the required power consumption of the transceiver to communicate at a targeted distance. For example, for 20 dBm output power delivered by a PA with 20% efficiency, 0.1 dB loss is equivalent to ~10 mW more power consumption. At mm-wave frequencies, integrated passive components exhibit more loss as compared to RF frequencies, making the design of a low-loss mm-wave TRSW a significant challenge.

Embodiments and/or aspects are disclosed that use a transmission line based TRSW which reduces a required length of the transmission line. The embodiments include placing shunt switches on primary/secondary coils of transmit (TX) and receive (RX) transformer based matching networks. As a result, the transformers perform a part of a short-to-open impedance transformation instead of the transmission line, such as a wavelength($\lambda$)/4 transmission line. The transformer impedance transformation allows for a shorter transmission line (i.e., less than $\lambda$/4) to complete the remainder of the impedance transformation.

Embodiments and/or aspects are also disclosed that utilize a transmitter power amplifier (PA) as a shunt switch in RX mode instead of adding an explicit switch at the output of the PA and as a result, this TRSW architecture uses only one additional shunt switch at the input of the low noise amplifier (LNA) instead of two shunt switches.

FIG. 1 illustrates a user device 100 in accordance with an aspect. The user device 100 may be a mobile device or a wearable device in some aspects and includes an application processor 105, baseband processor 110 (also referred to as a baseband module), radio front end module (RFEM) 115, memory 120, connectivity module 125, near field communication (NFC) controller 130, audio driver 135, camera driver 140, touch screen 145, display driver 150, sensors 155, removable memory 160, power management integrated circuit (PMIC) 165 and smart battery 170. The user device 100 can include and/or be incorporated with human proximity sensing circuitry.

In some aspects, application processor 105 may include, for example, one or more CPU cores and one or more of cache memory, low drop-out voltage regulators (LDOs), interrupt controllers, serial interfaces such as serial peripheral interface (SPI), inter-integrated circuit (I$^2$C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 110 may be implemented, for example, as a solder-down substrate including one or more integrated circuits, a single packaged integrated circuit soldered to a main circuit board, and/or a multi-chip module containing two or more integrated circuits.

Figure 2:
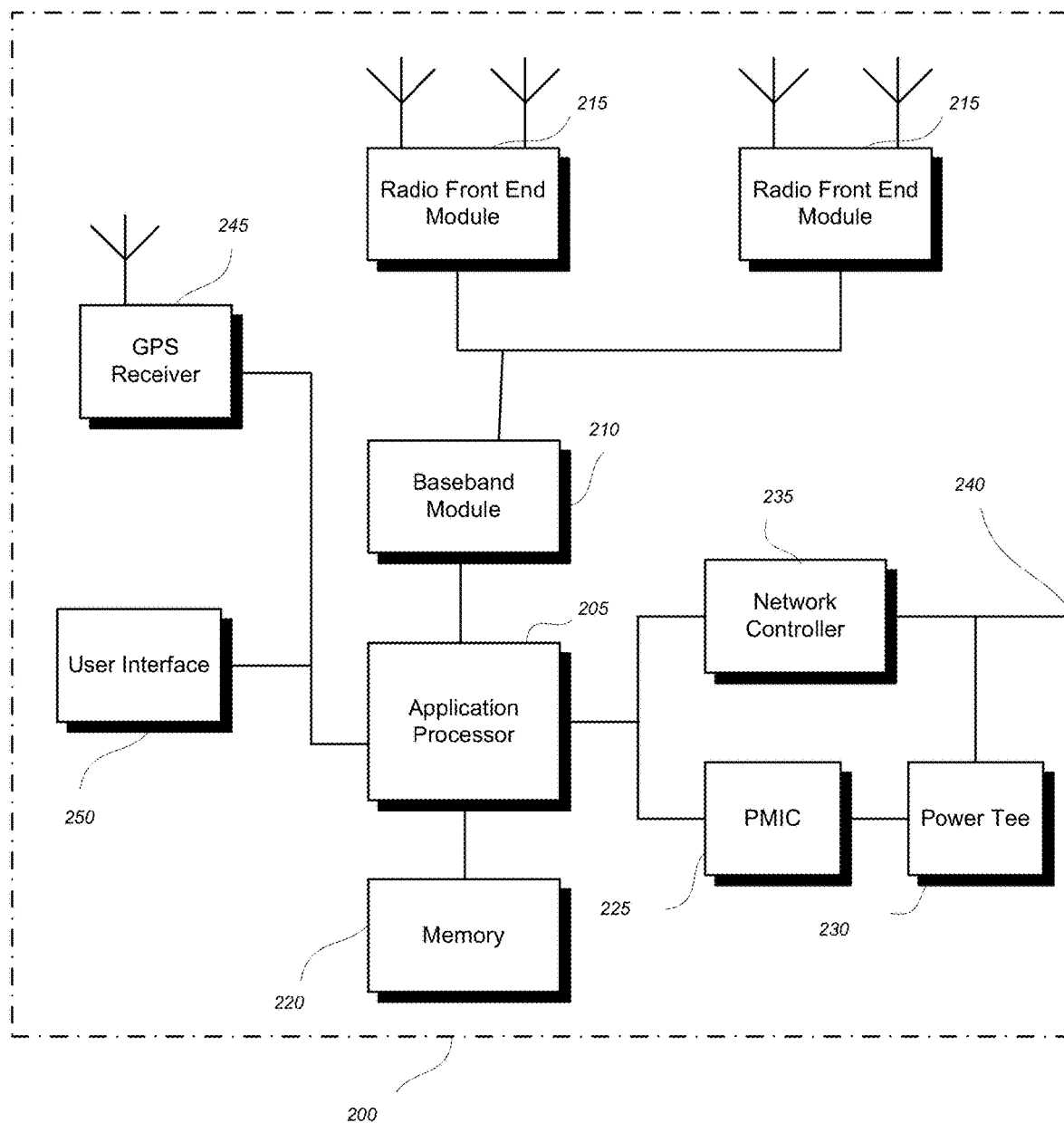
FIG. 2 illustrates an exemplary base station or infrastructure equipment radio head in accordance with an aspect.

FIG. 2 illustrates a base station or infrastructure equipment radio head 200 in accordance with an aspect. The base station radio head 200 may include one or more of application processor 205, baseband modules 210, one or more radio front end modules 215, memory 220, power management circuitry 225, power tee circuitry 230, network controller 235, network interface connector 240, satellite navigation receiver module 245, and user interface 250.

In some aspects, application processor 205 may include one or more CPU cores and one or more of cache memory, low drop-out voltage regulators (LDOs), interrupt controllers, serial interfaces such as SPI, I$^2$C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip module containing two or more integrated circuits.

In some aspects, memory 220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable to provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide data to application processor 205 which may include one or more of position data or time data. Application processor 205 may use time data to synchronize operations with other radio base stations.

In some aspects, user interface 250 may include one or more of physical or virtual buttons, such as a reset button, one or more indicators such as light emitting diodes (LEDs) and a display screen.

It is appreciated that the radio head 200 can also include a single RF front end module, including a single RF front end module for MIMO.

Figures 3A, 3B:
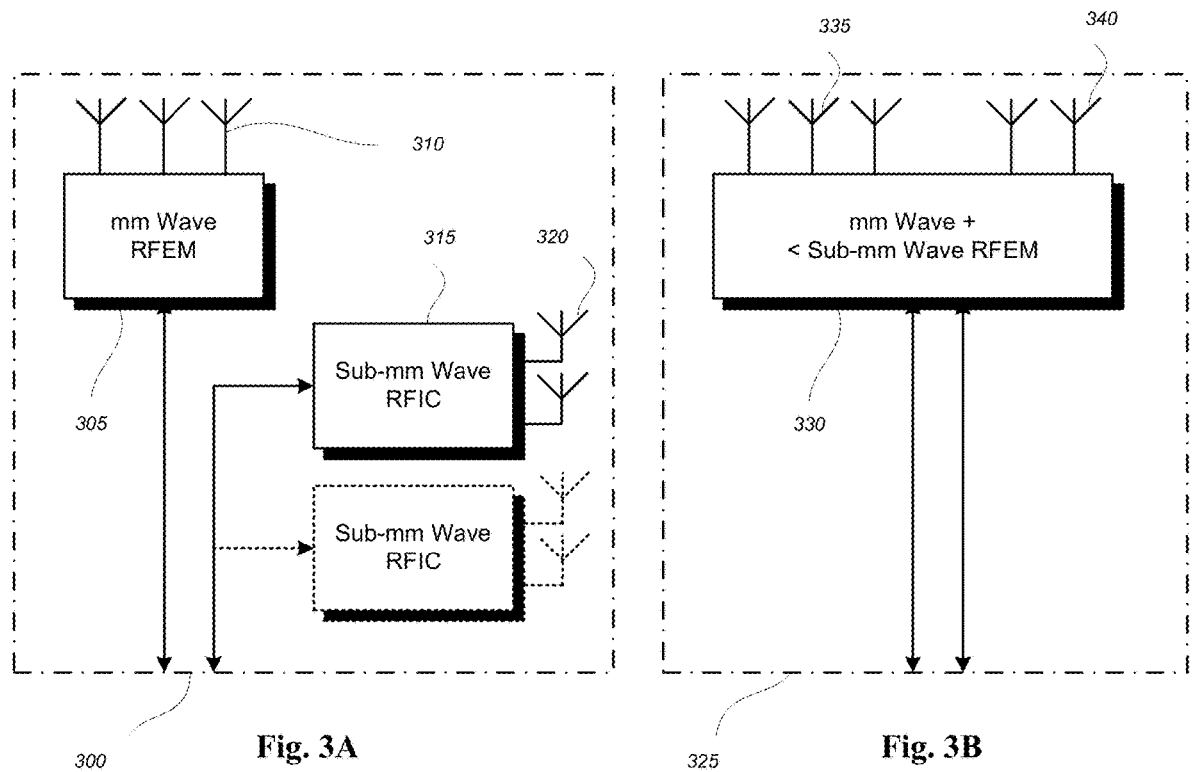
FIG. 3A and FIG. 3B illustrate aspects of an exemplary radio front end module.

FIG. 3A and FIG. 3B illustrate aspects of a radio front end module.

FIG. 3A illustrates an aspect of a radio front end module 300 incorporating a millimeter wave radio front end module (RFEM) 305 and one or more sub-millimeter wave radio frequency integrated circuits (RFIC) 315. In this aspect, the one or more sub-millimeter wave RFICs 315 may be physically separated from a millimeter wave RFEM 305. RFICs 315 may include connection to one or more antennas 320. RFEM 305 may be connected to multiple antennas 310.

FIG. 3B illustrates an alternate aspect of a radio front end module 325. In this aspect, both millimeter wave and sub-millimeter wave radio functions may be implemented in the same physical radio front end module 330. RFEM 330 may incorporate both millimeter wave antennas 335 and sub-millimeter wave antennas 340.

Figure 4A:
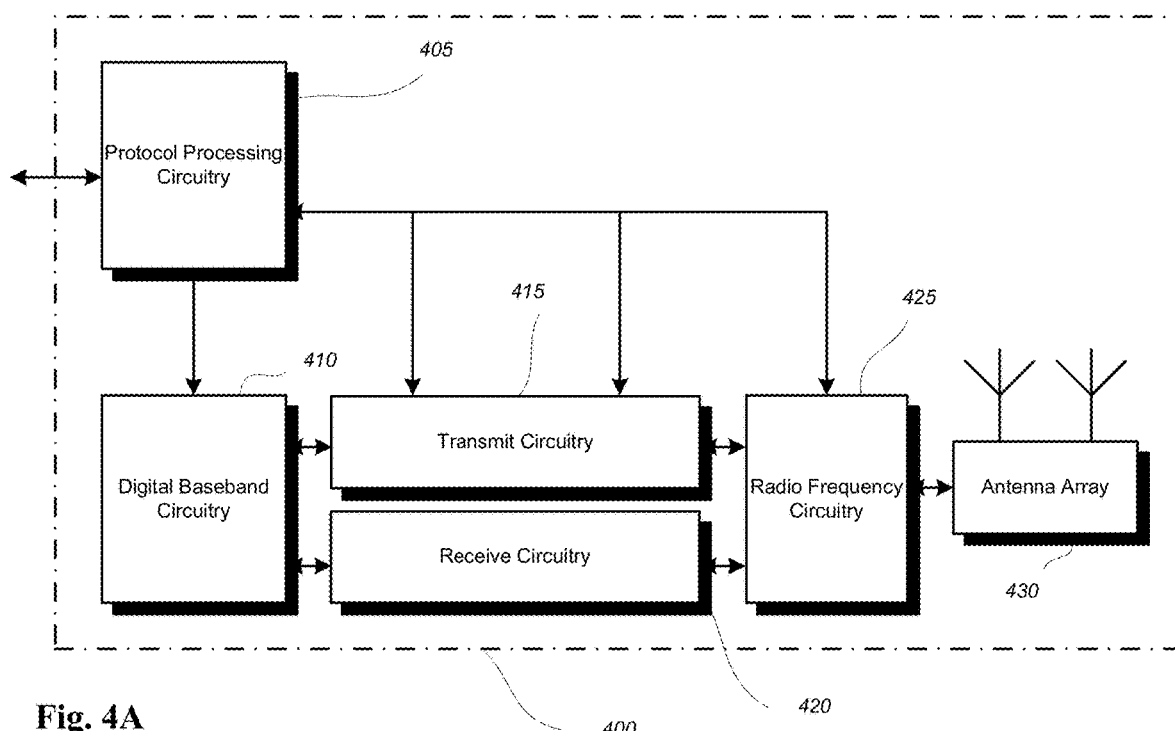
FIG. 4A illustrates an exemplary millimeter wave communication circuitry 400 according to some aspects.

FIG. 4A illustrates an exemplary millimeter wave communication circuitry 400 according to some aspects. Circuitry 400 is alternatively grouped according to functions. Components as shown in 400 are shown here for illustrative purposes and may include other components not shown here in FIG. 4A.

Millimeter wave communication circuitry 400 may include protocol processing circuitry 405, which may implement one or more of medium access control (MAC), radio link control (RLC), packet data convergence protocol (PDCP), radio resource control (RRC) and non-access stratum (NAS) functions. Protocol processing circuitry 405 may include one or more processing cores (not shown) to execute instructions and one or more memory structures (not shown) to store program and data information.

Millimeter wave communication circuitry 400 may further include digital baseband circuitry 410, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 400 may further include transmit circuitry 415, receive circuitry 420 and/or antenna array circuitry 430.

Millimeter wave communication circuitry 400 may further include radio frequency (RF) circuitry 425. In an aspect of the invention, RF circuitry 425 may include multiple parallel RF chains for one or more of transmit or receive functions, each connected to one or more antennas of the antenna array 430.

In an aspect of the disclosure, protocol processing circuitry 405 may include one or more instances of control circuitry (not shown) to provide control functions for one or more of digital baseband circuitry 410, transmit circuitry 415, receive circuitry 420, and/or radio frequency circuitry 425.

Figure 4B:
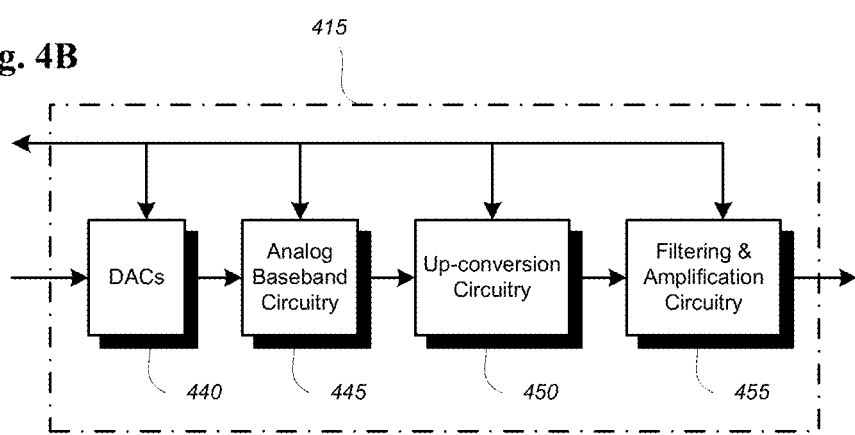
FIGS. 4B and 4C illustrate examples for transmit circuitry in FIG. 4A in some aspects.
Figure 4C:
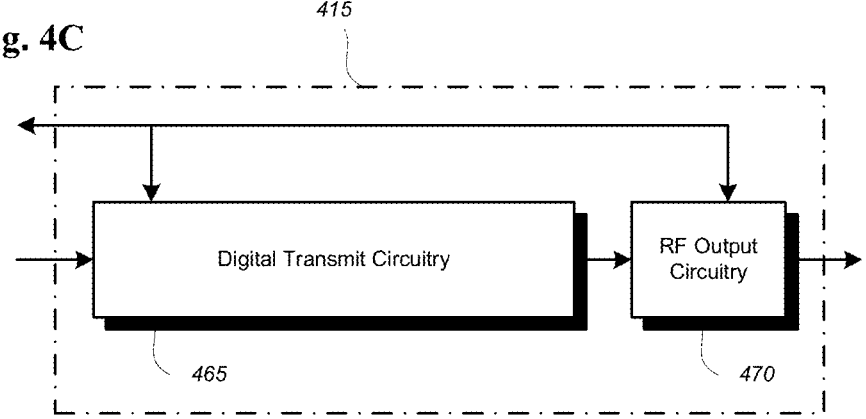

FIGS. 4B and 4C illustrate examples for transmit circuitry 415 in FIG. 4A in some aspects.

The exemplary transmit circuitry 415 of FIG. 4B may include one or more of digital to analog converters (DACs) 440, analog baseband circuitry 445, up-conversion circuitry 450 and filtering and amplification circuitry 455. In another aspect, 4C illustrates an exemplary transmit circuitry 415 which includes digital transmit circuitry 465 and output circuitry 470.

Figure 4D:
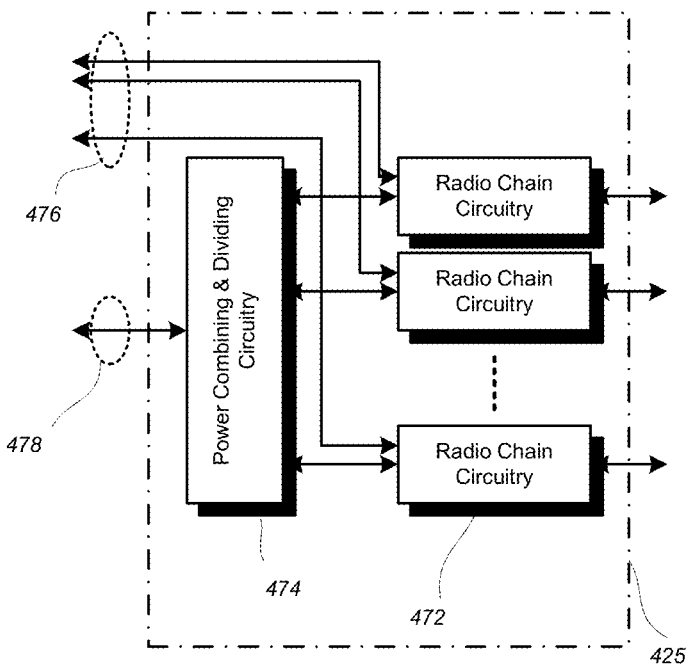
FIG. 4D illustrates an exemplary radio frequency circuitry in FIG. 4A according to some aspects.

FIG. 4D illustrates an exemplary radio frequency circuitry 425 in FIG. 4A according to some aspects.

Radio frequency circuitry 425 may include one or more instances of radio chain circuitry 472, which in some aspects may include one or more filters, power amplifiers, low noise amplifiers, programmable phase shifters and power supplies (not shown).

Radio frequency circuitry 425 may include power combining and dividing circuitry 474 in some aspects. In some aspects, power combining and dividing circuitry 474 may operate bidirectionally, such that the same physical circuitry may be configured to operate as a power divider when the device is transmitting, and as a power combiner when the device is receiving. In some aspects, power combining and dividing circuitry 474 may one or more include wholly or partially separate circuitries to perform power dividing when the device is transmitting and power combining when the device is receiving. In some aspects, power combining and dividing circuitry 474 may include passive circuitry comprising one or more two-way power divider/combiners arranged in a tree. In some aspects, power combining and dividing circuitry 474 may include active circuitry comprising amplifier circuits.

In some aspects, radio frequency circuitry 425 may connect to transmit circuitry 415 and receive circuitry 420 in FIG. 4A via one or more radio chain interfaces 476 or a combined radio chain interface 478.

In some aspects, one or more radio chain interfaces 476 may provide one or more interfaces to one or more receive or transmit signals, each associated with a single antenna structure which may comprise one or more antennas.

In some aspects, the combined radio chain interface 478 may provide a single interface to one or more receive or transmit signals, each associated with a group of antenna structures comprising one or more antennas.

Figure 4E:
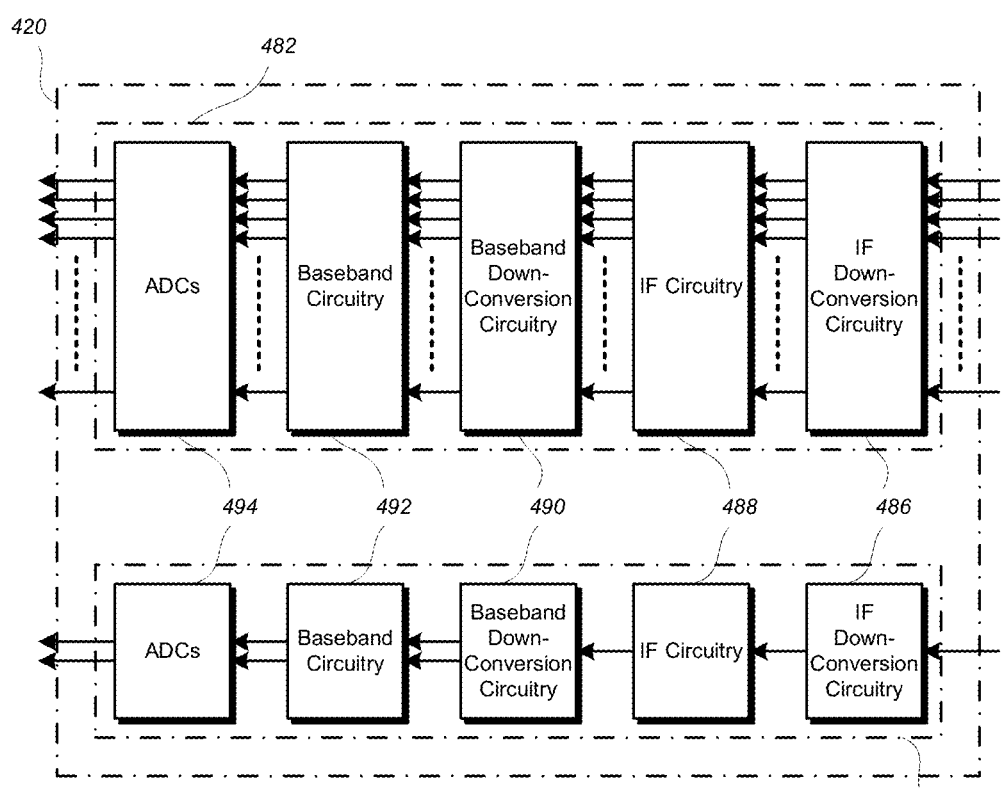
FIG. 4E illustrates exemplary receive circuitry in FIG. 4A according to some aspects.

FIG. 4E illustrates exemplary receive circuitry 420 in FIG. 4A according to some aspects. Receive circuitry 420 may include one or more of parallel receive circuitry 482 and/or one or more of combined receive circuitry 484.

In some aspects, the one or more parallel receive circuitry 482 and one or more combined receive circuitry 484 may include one or more Intermediate Frequency (IF) down-conversion circuitry 486, IF processing circuitry 488, baseband down-conversion circuitry 490, baseband processing circuitry 492 and analog-to-digital converter (ADC) circuitry 494.

Figure 5:
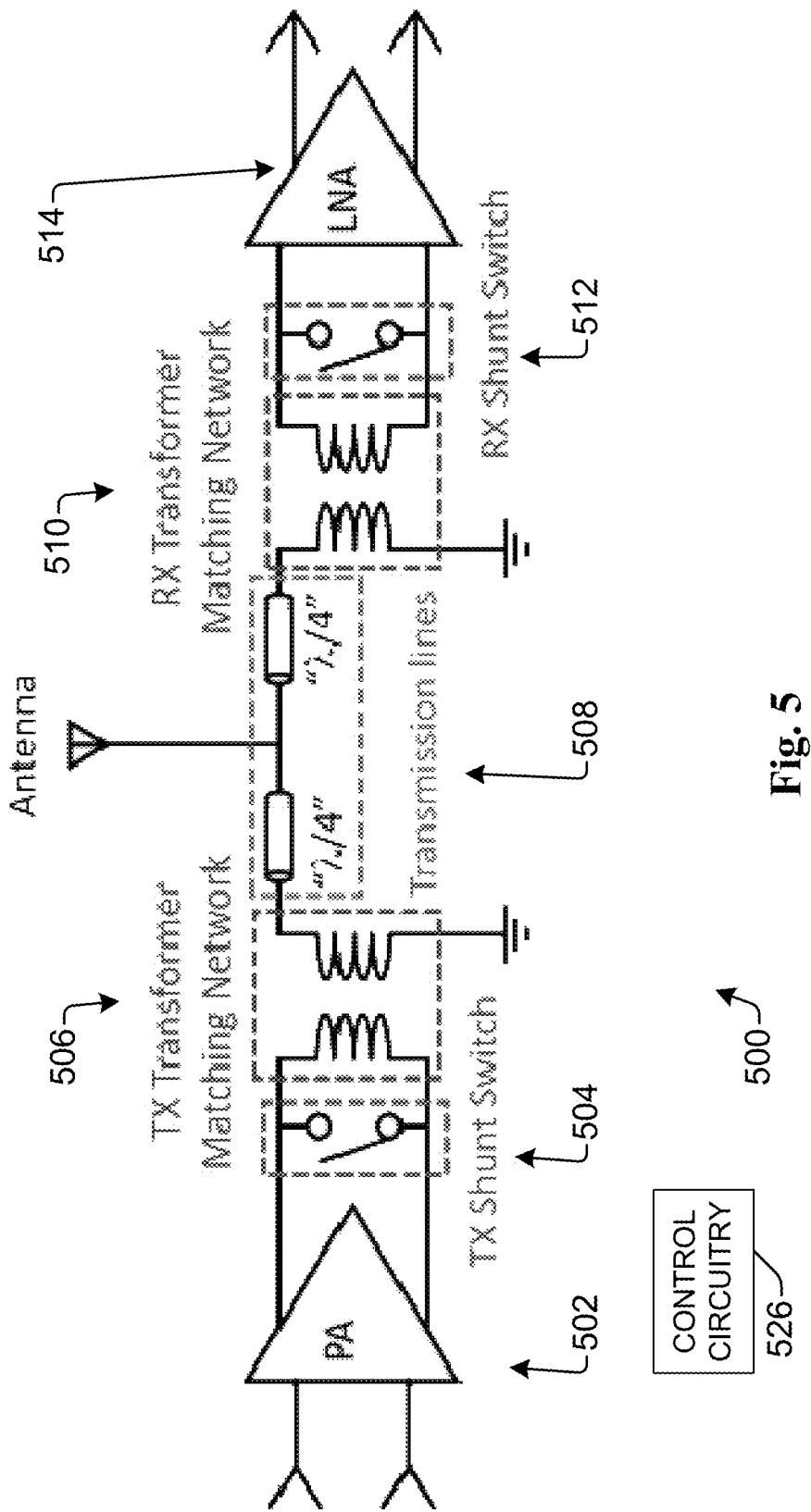
FIG. 5 is a diagram illustrating an arrangement for a transmit receive switch (TRSW) system in accordance with some embodiments and/or aspects.

FIG. 5 is a diagram illustrating an arrangement for a transmit receive switch (TRSW) system 500 in accordance with some embodiments and/or aspects. The system includes transformer matching networks configured to partially perform impedance transformation and permit use of shorter transmission lines (i.e., lines less than λ/4).

The system 500 can be implemented in front end circuitry, such as the radio front end module 115, the radio front end module 215, the radio front end module 300, the radio front end module 325 and variations thereof. The system 500 can be used with user device 100, a base station or infrastructure equipment radio head 200 and the like.

The system 500 can reduce silicon area consumption of low-loss mmWave TRSWs. Additionally, a smaller die front-end area can enable a larger number of transceivers to be integrated on a fixed amount of silicon area, thereby reducing the silicon cost of large-scale phased array systems and offering potential cost and area advantages. Further, a reduced length of the transmission line can reduce the insertion loss of the TRSW even further.

The system 500 includes a TX power amplifier (PA) 502, a TX shunt switch 504, a TX transformer matching network 506, transmission lines 508, an antenna or antenna port, a RX transformer matching network 510, a RX shunt switch 512, and a low noise amplifier (LNA).

The system 500 includes transformer based matching networks 506 and 510. Transformer based matching networks have a small size and generally provide a low insertion loss at mmWave frequencies. However, it is appreciated that other types of matching networks can be used.

A transmitter of the system 500 generally includes the PA 502, the TX shunt switch 504, the TX transformer matching network 506 and at least a portion (left half) of the transmission lines 508, referred to as TX transmission line. A receiver of the system 500 generally includes the LNA 514, the RX shunt switch 512, the RX transformer matching network 510 and at least a portion (right half) of the transmission lines 508, referred to as RX transmission line. The transmission lines 508 are shown as having lengths of "λ/4" to indicate that their lengths are less than λ/4.

The system 500 has a TX mode, where the transmitter or TX path is active (operates) and sends a signal for transmission to the antenna port. During the TX mode, the RX path is inactive. The system 500 also has a RX mode, where the receiver operates and receives a transmitted signal from the antenna port. During the RX mode, the TX path is inactive.

The TX PA 502 receives baseband signals and the like from a baseband module and amplifies the signal to generate a TX signal. In this example, the TX PA 502 receives a differential type signal at its input and supplies the TX signal as a differential signal at its output.

The TX shunt switch 504 is connected to the output of the TX PA 502 and a first coil of the TX transformer matching network 506. In particular, the TX shunt switch 504 is connected in parallel to the first coil. In the TX mode, the TX shunt switch 504 is open creating an open circuit across its terminals. In the RX mode, the TX shunt switch is closed thereby shorting ends of the first coil of the TX transformer matching network 506. As a result, the transmitter is essentially disabled in the RX mode.

The TX transformer matching network 506 includes the first coil and the second coil and conveys the TX signal from the first coil to the second coil. The second coil is also referred to as its output, which is connected to the TX transmission line (left half). The TX transformer matching network 506 performs impedance matching to the antenna port. Additionally, the network 506 performs a partial short-to-open impedance transformation when switching from TX mode to RX mode. This partial short-to-open impedance transformation reduces the impedance transformation performed by the TX transmission line, thus allowing a shorter TX transmission line.

In one example, the TX transmission line has a transmission length of less than λ/4 and the TX transmission line and the TX transformer matching network provide a combined impedance transformation of λ/4.

The RX transmission line is also connected to the antenna port and receives a signal from the antenna port. The RX transmission line has a transmission length of less than λ/4.

The RX transformer matching network 510 includes a first coil and a second coil and conveys the received signal from the first coil to the second coil. The first coil is its input and is connected to the RX transmission line and ground as shown. The second coil is also referred to as its output, which is connected to the RX shunt switch 512. The RX transformer matching network 510 performs impedance matching for the antenna port. Additionally, the network 510 performs a partial short-to-open impedance transformation when switching from RX mode to TX mode. This partial short-to-open impedance transformation reduces the impedance transformation performed by the RX transmission line, thus allowing a shorter RX transmission line.

The RX shunt switch 512 is connected to the output/second coil of the RX transformer matching network 510 and to an input of the LNA 514. The RX shunt switch 512 is connected in parallel to the second coil of 510. In the RX mode, the RX shunt switch 512 is open creating an open circuit across its terminals. In the TX mode, the RX shunt switch is closed thereby shorting ends of the second coil of the RX transformer matching network 510. As a result, the receiver is essentially disabled in the TX mode.

The RX LNA 514 amplifies the received signal and provides the amplified received signal at its output. The output of the LNA 514 can be connected to a baseband module and the like.

In one example, the RX transmission line has a transmission length of less than λ/4 and the RX transmission line and the RX transformer matching network 510 provide a combined impedance transformation of λ/4.

In operation, when the TX network 506 is shorted (ideal zero resistance) by the TX shunt switch 504, the transmitter has an impedance to the receiver as an open circuit or infinite impedance (ideal). Similarly, when the RX network 510 is shorted (ideal zero resistance) by the RX shunt switch 512, the receiver has an impedance to the transmitter as an open circuit or infinite impedance (ideal).

Control circuitry 526 can be included with the system 500 and configured to control operation of the TX switch 504 and the RX switch 512. The control circuitry 526 can also be configured to control timing of the switches 504 and 512 when transferring from one mode to another for the TX and RX paths.

It is appreciated that the system 500 is provided for illustrative purposes and that suitable variations are contemplated.

The shunt switches 504 and 512 are typically configured to handle a range of frequencies, such as mmWave frequencies. In some aspects, capacitors or capacitive units can be configured to couple to the shunt switches. The shunt switches can have associated parasitic capacitances when in the OFF state (inactive path). These capacitances can change a resonance frequency of matching networks. Thus, the matching networks 506 and 510 can be designed or configured to compensate for parasitic capacitances of the OFF state of the shunt switches.

In one variation, the TX shunt switch 504 is incorporated into the PA 502, which can reduce complexity, mitigate parasitic capacitance and simplify operation.

Figure 6:
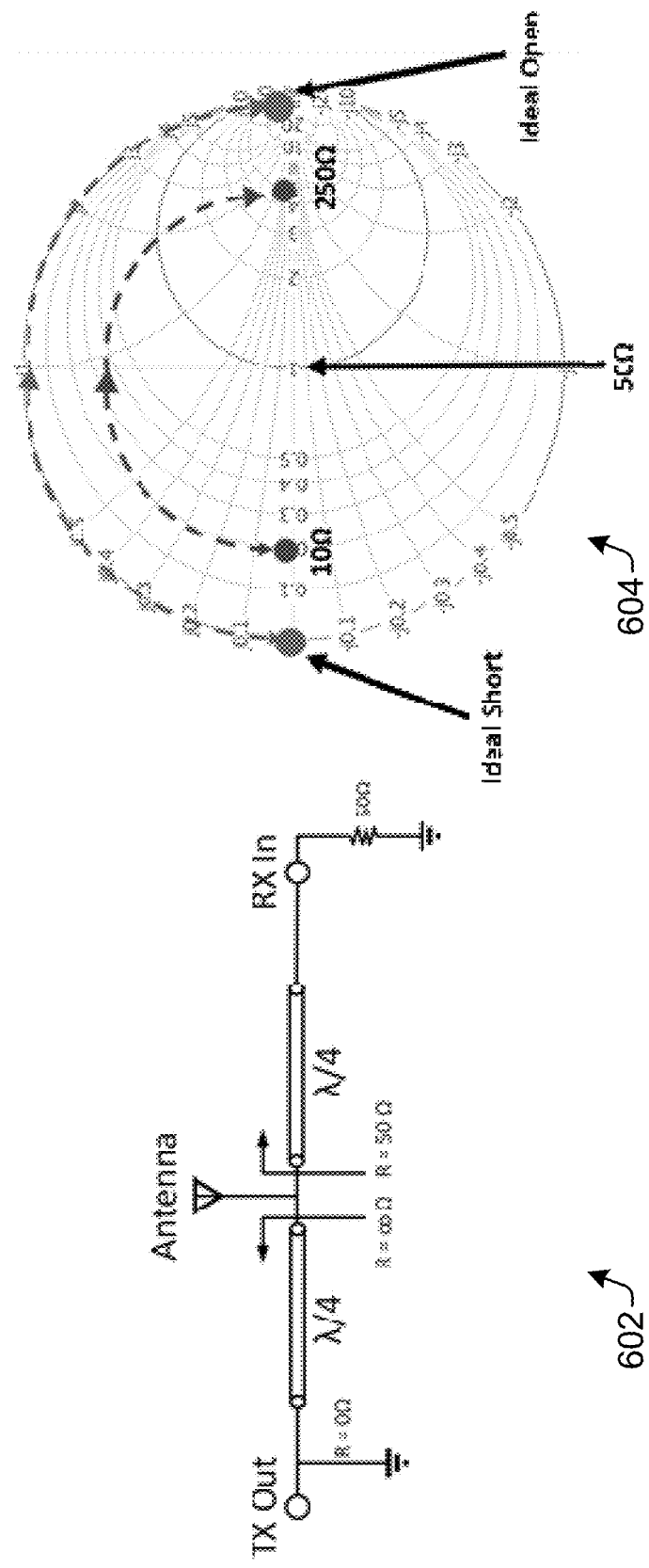
FIG. 6 is a diagram illustrating impedance transformation for the receive mode in accordance with some embodiments.

FIG. 6 is a diagram illustrating impedance transformation for the receive mode in accordance with some embodiments. The transformation is provided for illustrative purposes and it is appreciated that suitable variations are contemplated.

FIG. 6 depicts an example TRSW system 602 and a Smith chart 604.

In the receive mode, the impedance seen at the antenna port by the transmitter appears as an infinite impedance or open circuit (under ideal conditions). Further, an impedance across the TX matching network is shown as 0 ohm, which causes the open circuit.

The receiver has an impedance or matching impedance seen at the antenna port as a load impedance. The load impedance, in one example, is 50 ohm. Thus, the receiver can operate and receive signals without interference and/or substantial interference from the transmitter.

The chart 604 shows the impedance transformation as a 180 degree clock-wise rotation pivoted at the origin. A magnitude of the rotation is determined by a length of the transmission line with $\lambda/4$ equal to 180 degrees of rotation. For non-zero resistance terminations, as is the case for real implementations, the quality of the open circuit approximation is determined by the proximity to zero of impedance that can be created, the lower the termination resistance, the higher the transformed impedance seen at the other end of the transmission line. Ideally, an open circuit is desired at the antenna port or interface so that there is no loading of the antenna port by the inactive path (transmitter or TX path in RX mode and receiver or RX path in TX mode) allowing all the power to be delivered to the antennal. The active path presents a 50 ohm termination to its transmission line, satisfying power transfer or optimal power transfer to/from the antenna port.

An outer dashed line on the chart shows an ideal impedance transformation for the inactive path (TX path in this example). An inner dashed line shows an example implementation where a low impedance (10 ohm) is transformed to a high impedance (250 ohm).

Figure 7:
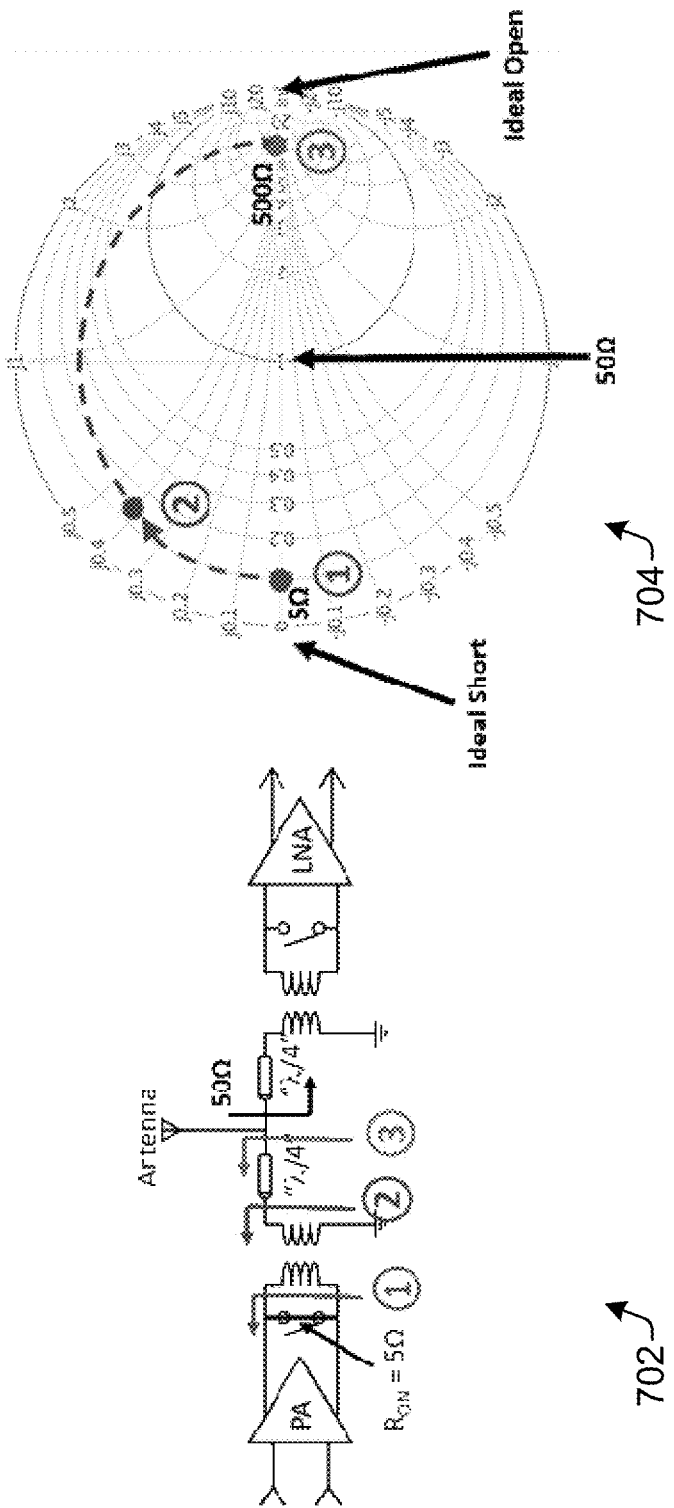
FIG. 7 depicts an example TRSW system and a Smith chart.

FIG. 7 is a diagram illustrating impedance transformation for the receive mode in accordance with some embodiments. The transformation is provided for illustrative purposes and it is appreciated that suitable variations are contemplated.

FIG. 7 depicts an example TRSW system 702 and a Smith chart 704. The system 702 includes transformer based matching networks having shunt switches as shown. In one example, the system 702 is the system 500 shown above.

Instead of terminating an inactive transmission line with a short circuit (to ground), a transformer based matching network is between the shunt switch and the transmission line as shown. As a result, the transformer based matching network provides a partial rotation of the short-circuit impedance, and this rotated impedance terminates the inactive transmission line. The inactive transmission line is responsible for providing the remainder of the rotation, which is less than 180 degrees and, as a result, the length of the inactive transmission line is less than $\lambda/4$.

In this example, the TX path or transmitter is the inactive path while the RX path or receiver is active.

In the receive mode, the impedance seen at the antenna port by the transmitter appears as an infinite impedance or open circuit (under ideal conditions). Further, an impedance across the TX matching network is shown as 0 ohm, which causes the open circuit.

The receiver has an impedance or matching impedance seen at the antenna port as a load impedance. The load impedance, in one example, is 50 ohm. Thus, the receiver can operate and receive signals without interference and/or substantial interference from the transmitter.

The chart 704 shows the impedance transformation as a 180 degree clock-wise rotation pivoted at the origin. A magnitude of the rotation is determined by a length of the inactive transmission line and the inactive matching network, which combines to $\lambda/4$ or 180 degrees of rotation. For non-zero resistance terminations, as is the case for real implementations, the quality of the open circuit approximation is determined by the proximity to zero of impedance that can be created, the lower the termination resistance, the higher the transformed impedance seen at the other end of the transmission line. Ideally, an open circuit is desired at the antenna port or interface so that there is no loading of the antenna port by the inactive path (transmitter or TX path in RX mode and receiver or RX path in TX mode) allowing all the power to be delivered to the antennal. The active path presents a 50 ohm termination to its transmission line, satisfying power transfer or optimal power transfer to/from the antenna port.

The system 702 indicates impedance seen ant point 1, point 2 and point 3 as shown. Here, the TX shunt switch is closed, therefore the impedance seen at point 1 is low, shown as 5 ohm in this example. Ideally, the impedance would be zero. Point 1 is also shown in the chart 704.

The TX transformer based matching network performs a partial impedance transformation seen at point 2. This partial impedance transformation is also shown in the chart 704 as point 2. Thus, it can be seen that the impedance moves from near zero to a larger value.

The TX transmission line performs the remaining impedance transformation at point 3. This transformation is also shown in the chart 704 as point 3. The remaining impedance transformation completes the 180 degrees and is ideally infinite or open circuit. In one example, the resulting impedance transformation is 5000 ohm, as shown.

It is appreciated that the example shown in FIG. 7 can be extended to an inactive receiver (i.e., inactive RX path) and an active transmitter (i.e., active TX path), where the inactive RX path provides a similar impedance transformation based on the RX transformer based matching network and the RX transmission line (when inactive).

Figure 8:
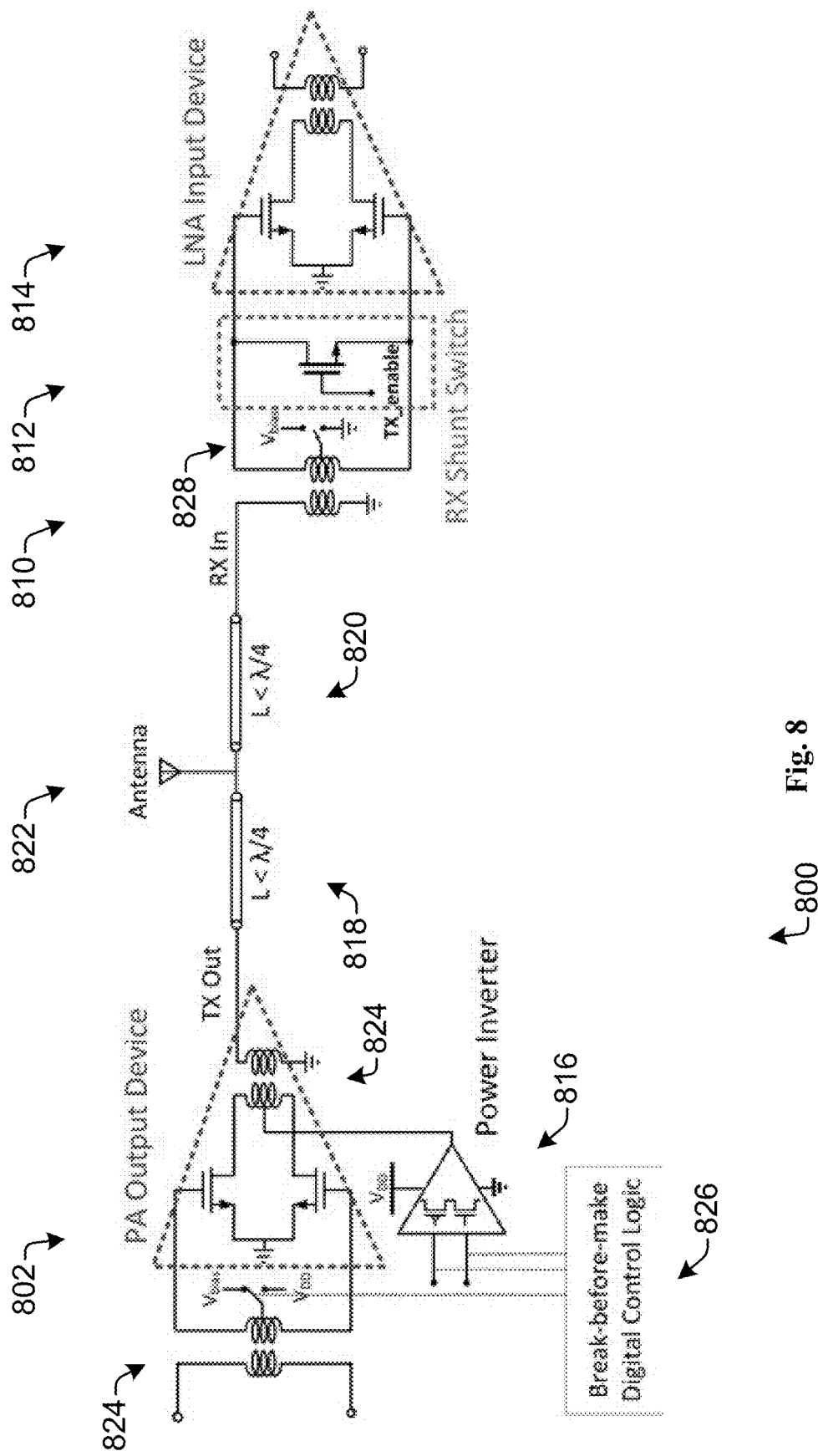
FIG. 8 is a diagram illustrating an arrangement for a transmit receive switch (TRSW) system in accordance with some embodiments and/or aspects.

FIG. 8 is a diagram illustrating an arrangement for a transmit receive switch (TRSW) system 800 in accordance with some embodiments and/or aspects. In this example, operation of a shunt switch is incorporated into a power amplifier of a TX path. The system 800 includes transformer based matching networks configured to partially perform impedance transformation and permit use of shorter transmission lines (i.e., lines less than $\lambda/4$).

The system 800 can be implemented in front end circuitry, such as the radio front end module 115, the radio front end module 215, the radio front end module 300, the radio front end module 325 and variations thereof. The system 800 can be used with user device 100, a base station or infrastructure equipment radio head 200 and the like.

The system 800 is similar in operation to the system 500 and variations thereof.

The system 800 includes a TX path (transmitter) and a receive path (receiver), each coupled to an antenna or antenna port 822.

The system 800 has a TX mode, where the transmitter or TX path operates/active and sends a signal for transmission to the antenna port, and a RX mode, where the receiver operates/active and receives a transmitted signal from the antenna port.

The TX path includes a multifunction TX power amplifier (PA) 802, a TX transmission line 818 and control logic 816.

The RX path includes a RX transmission line 820, a RX transformer based matching network 810, a RX shunt switch 812 and a low noise amplifier (LNA) 814.

The RX transmission line 820 is also connected to the antenna port and receives a signal from the antenna port. The RX transmission line has a transmission length of less than $\lambda/4$.

The RX transformer matching network 810 includes a first coil and a second coil and conveys the received signal from the first coil to the second coil. The first coil is its input and is connected to the RX transmission line and ground as shown. The second coil is also referred to as its output, which is connected to the RX shunt switch 812. The RX transformer matching network 810 performs impedance matching for the antenna port. Additionally, the network 810 performs a partial short-to-open impedance transformation when switching from RX mode to TX mode. This partial short-to-open impedance transformation reduces the impedance transformation performed by the RX transmission line, thus allowing a shorter RX transmission line.

The RX shunt switch 812 is connected to the output/second coil of the RX transformer matching network 810 and to an input of the LNA 814. The RX shunt switch 812 is connected in parallel to the second coil of 810. In the RX mode, the RX shunt switch 812 is open creating an open circuit across its terminals. In the TX mode, the RX shunt switch is closed thereby shorting ends of the second coil of the RX transformer matching network 810. As a result, the receiver is essentially disabled in the TX mode.

The RX LNA 814 amplifies the received signal and provides the amplified received signal at its output. The output of the LNA 814 can be connected to a baseband module and the like.

The multifunction TX PA 802 receives baseband signals and the like from a baseband module and amplifies the signal to generate a TX signal. In this example, the TX PA 802 receives a differential type signal at its input and supplies the TX signal as a differential signal at its output.

The multifunction TX PA 802 integrates an amplifying device which can be reconfigured as a shunt switch and/or a transformer based matching network 824. The TX PA 802 operates as a low impedance shunt switch when the TX path is inactive (OFF). The PA 802, operates as a large amplifying device in order to provide gain and large output power when the TX path is active.

The TX matching network 824 performs a partial impedance transformation when the TX path is inactive.

A TX power amplifier (PA) 802, a TX shunt switch 804, a TX transformer matching network 806, transmission lines 808, an antenna or antenna port, a RX transformer matching network 810, a RX shunt switch 812, and a low noise amplifier (LNA).

The system 800 includes transformer based matching networks that generally provide a low insertion loss at mmWave frequencies. However, it is appreciated that other types of matching networks can be used.

The TX transformer matching network 824 includes the first coil and the second coil and conveys the TX signal from the first coil to the second coil. The second coil is also referred to as its output, which is connected to the TX transmission line (left half). The TX transformer matching network 824 performs impedance matching to the antenna port. Additionally, the network 824 performs a partial short-to-open impedance transformation when switching from TX mode to RX mode. This partial short-to-open impedance transformation reduces the impedance transformation performed by the TX transmission line, thus allowing a shorter TX transmission line.

In one example, the TX transmission line has a transmission length of less than $\lambda/4$ and the TX transmission line and the TX transformer matching network provide a combined impedance transformation of $\lambda/4$.

The RX transmission line is also connected to the antenna port and receives a signal from the antenna port. The RX transmission line has a transmission length of less than $\lambda/4$.

In one example, the RX transmission line has a transmission length of less than $\lambda/4$ and the RX transmission line and the RX transformer matching network 810 provide a combined impedance transformation of $\lambda/4$.

In operation, when the TX network 806 is shorted (ideal zero resistance) by the TX shunt switch 804, the transmitter has an impedance to the receiver as an open circuit or infinite impedance (ideal). Similarly, when the RX network 810 is shorted (ideal zero resistance) by the RX shunt switch 812, the receiver has an impedance to the transmitter as an open circuit or infinite impedance (ideal).

The shunt switch 812 is typically configured to handle a range of frequencies, such as mmWave frequencies. The shunt switches can have associated parasitic capacitances when in the OFF state (inactive path). These capacitances can change a resonance frequency of matching networks. Thus, the matching networks can be designed or configured to compensate for parasitic capacitances of the OFF state of the shunt switches and/or, in the case of the PA 802, parasitic capacitances of the OFF/inactive state for the PA.

The TX PA 802 is configured or reconfigured as a shunt switch in the OFF state (or inactive). Gate and drain voltages of the PA 802 are switched depending on the mode of operation. In TX mode, the PA gate is connected to a nominal bias voltage while its drain is connected to VDD. In the RX mode (TX path inactive), the gate is pulled up to VDD while the drain is tied to ground to create a low resistance channel through the transistor. The switching to the gate and drain voltages occurs at a center tap of primary and secondary coils and has little to no impact on differential operation of the PA 802 since the center tap is a small-signal ground in differential mode. Thus, the impact on the PA 802 performance, if any, is very small. Switching of the gate is performed by gate switch 824.

A power inverter 816 is used on the drain path to perform switching operation between VDD and ground. A power inverter is utilized to mitigate voltage drop through the device when the PA 802 is conducting current. Voltage drop on the PA supply voltage can reduce the PA gain and, as a result, output power. A sufficiently large device can be used as it is connected to the center tap of the transformer and the PA performance is relatively insensitive to parasitics on that node.

Logic control circuitry 826, also referred to as break before make logic, is configured to control timing of the switching of the PA 802 gain and drain voltages as well as timing control of the power inverter 816. The circuitry 826 is coupled to the inverter 816 and the switch 824 and configured to ensure that the PA 802 does not have its gate connected to VDD while its drain is also connected to VDD, as this would cause a significant amount of current to flow through the device and potentially cause damage to the PA 802 and/or the system 800. Additionally, the circuitry 826 controls timing of PMOS and NMOS gates such that they are operated in a non-overlapping manner and are not conducting at the same time, which leads to large current to follow from VDD to GND. Spikes in current can cause undesirable effects on the system 800 due to supply transients.

The control circuitry 826 can also be configured to control operation of the RX shunt switch 812.

For the RX path, a gate for the LNA 814 is switched between a nominal bias voltage and ground by switch 828. In the TX mode, the TX path is active and the RX path is inactive. The RX shunt switch 812 is turned ON and the gate of the LNA 814 is connected to ground by the switch 828. The ground value appears at the drain and source of the RX shunt switch 812, increasing the overdrive voltage and thereby decreasing the ON resistance of the shunt switch. The decreased resistance allows a smaller switch device to be used for a given ON resistance, as compared to the case when the LNA gate is not dynamically switched.

It is appreciated that the system 800 is provided for illustrative purposes and that suitable variations are contemplated.

In one example, the TRSW system 800 is utilized for a 73 GHz transceiver in 22 nm CMOS. A simulated TX transmission line length for the TX path is 350 um as compared to the λ/4 length of 465 um (25% area reduction). For the RX path, the RX transmission line length is 375 um (20% area reduction). The integrated transmission line used in this example has ~2.6 dB/mm of loss at these frequencies. Thus, insertion loss contribution of the transmission line is reduced by 0.3 dB and 0.23 dB for TX and RX paths, respectively. It is appreciated that the magnitude of the insertion loss reduction can vary based on the quality of the integrated transmission line, with the largest improvement being obtained for a process with relatively high loss integrated transmission lines.

Thus, this system 800 and variations thereof can enable smaller area and lower loss transmission-line based transmit/receive switches to be designed at mmWave frequencies resulting in low cost and lower power phased-array systems.

Figure 9:
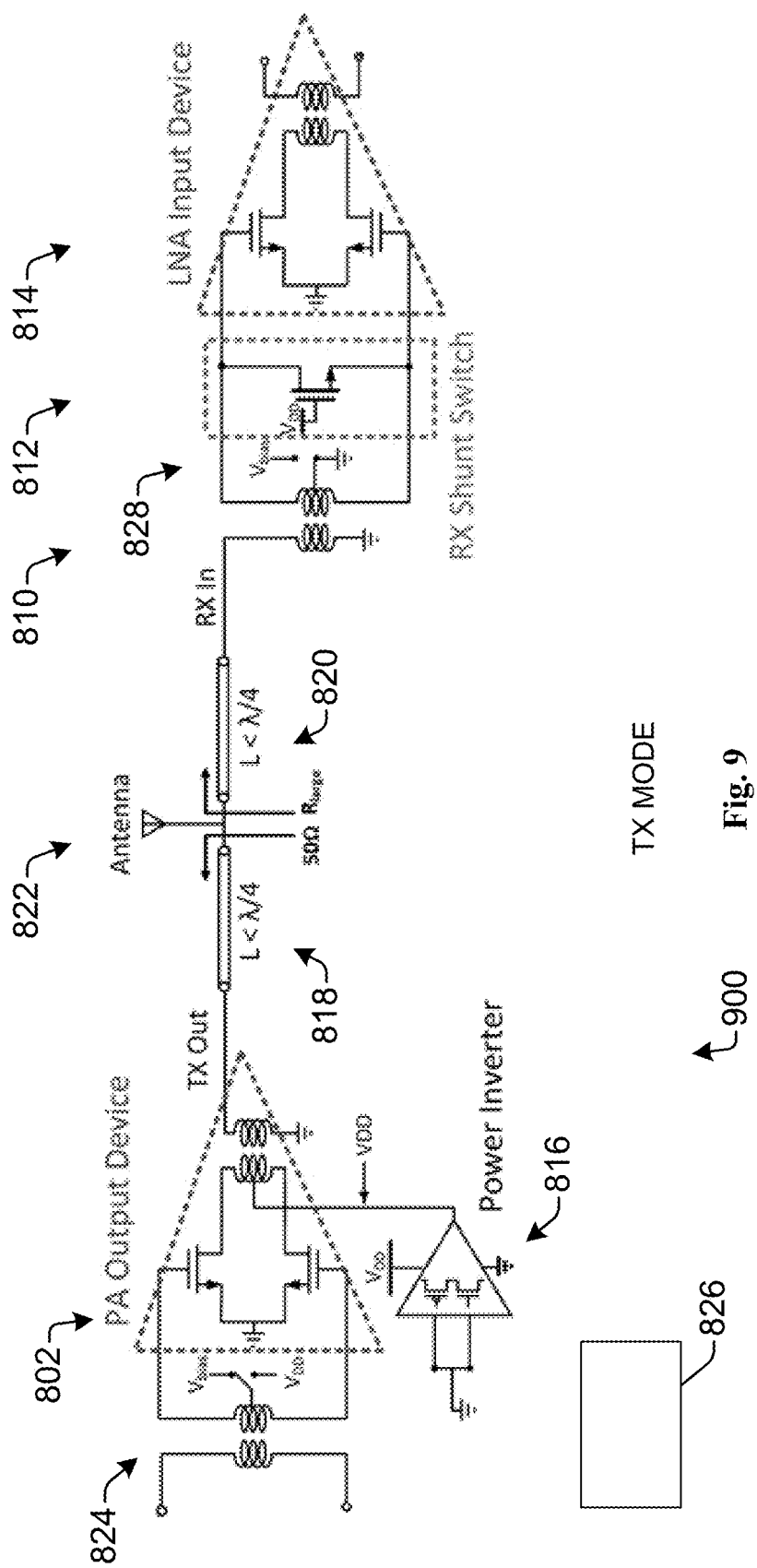
FIG. 9 is a diagram illustrating an arrangement for the transmit receive switch (TRSW) system operating in a transmit (TX) mode in accordance with some embodiments and/or aspects.
Figure 10:
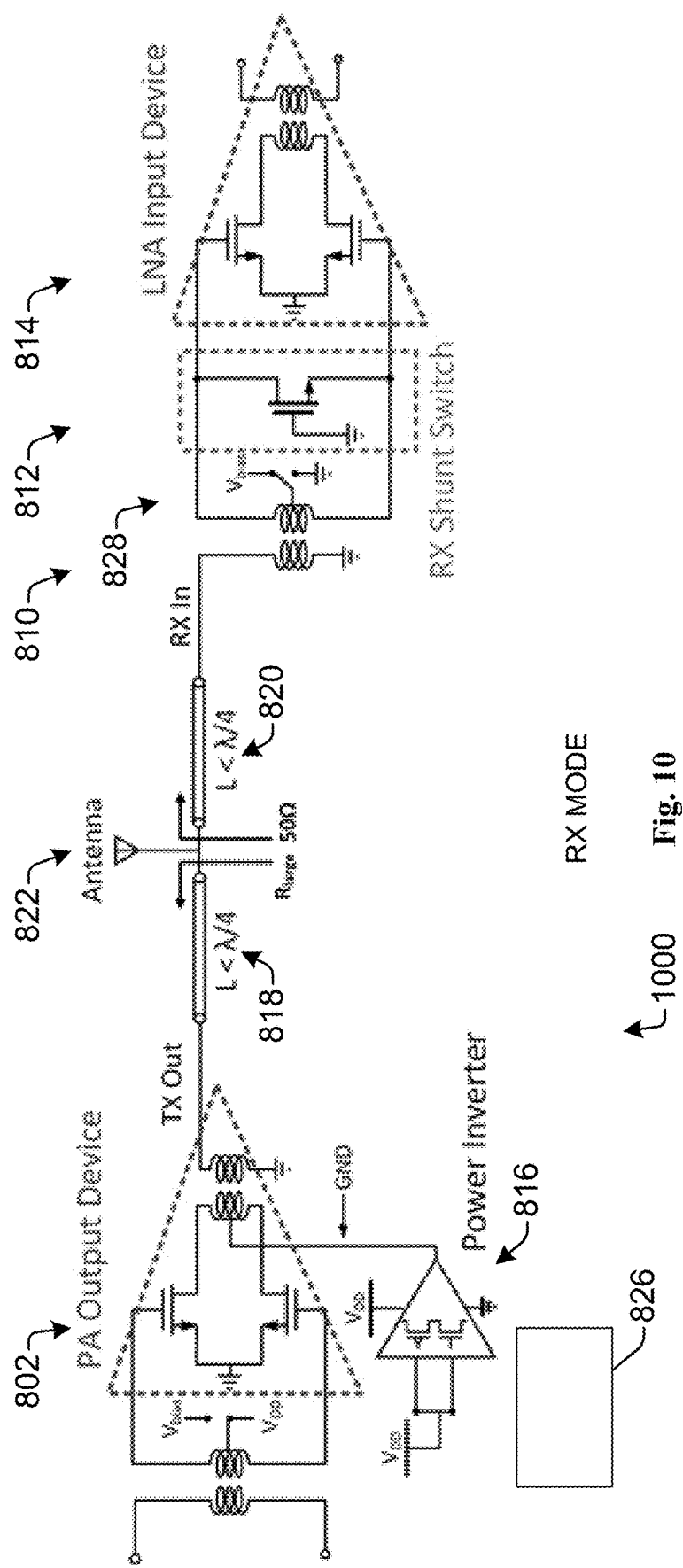
FIG. 10 is a diagram illustrating an arrangement for the transmit receive switch (TRSW) system operating in a receive (RX) mode in accordance with some embodiments and/or aspects.

FIGS. 9 and 10 further operate operation of the TRSW system 800 in TX and RX modes.

FIG. 9 is a diagram illustrating an arrangement for the transmit receive switch (TRSW) system 900 operating in a transmit (TX) mode in accordance with some embodiments and/or aspects.

In the TX mode, the TX path is active and the RX path is inactive. The circuitry 826 is configured to cause the power inverter to provide a supply voltage (VDD) to the drains of the PA 802. Additionally, the circuitry 826 is configured to cause the switch 824 to connect the gate of the PA 802 to a bias voltage (Vbias).

For the RX path, a gate of the shunt switch 812 is set to the supply voltage (VDD), which causes a short across the second coil of the RX transformer based matching network 810. Circuitry, such as the circuitry 826 or additional circuitry, can be used to control the shunt switch 812. Further, the gate of the LNA 814 is set to the ground by the switch 828, which is controlled by circuitry 826 or the additional circuitry.

FIG. 10 is a diagram illustrating an arrangement for the transmit receive switch (TRSW) system 1000 operating in a receive (RX) mode in accordance with some embodiments and/or aspects.

In the RX mode, the RX path is active and the TX path is inactive. For the TX path, the circuitry 826 is configured to cause the power inverter to provide ground to the drains of the PA 802. Additionally, the circuitry 826 is configured to cause the switch 824 to connect the gate of the PA 802 to a supply voltage (VDD).

For the RX path, a gate of the shunt switch 812 is set to the ground, which causes an open circuit or high impedance across the second coil of the RX transformer based matching network 810. Circuitry, such as the circuitry 826 or additional circuitry, can be used to control the shunt switch 812. Further, the gate of the LNA 8114 is set to the nominal bias voltage (Vbias) by the switch 828, which is controlled by circuitry 826 or the additional circuitry.

Figure 11:
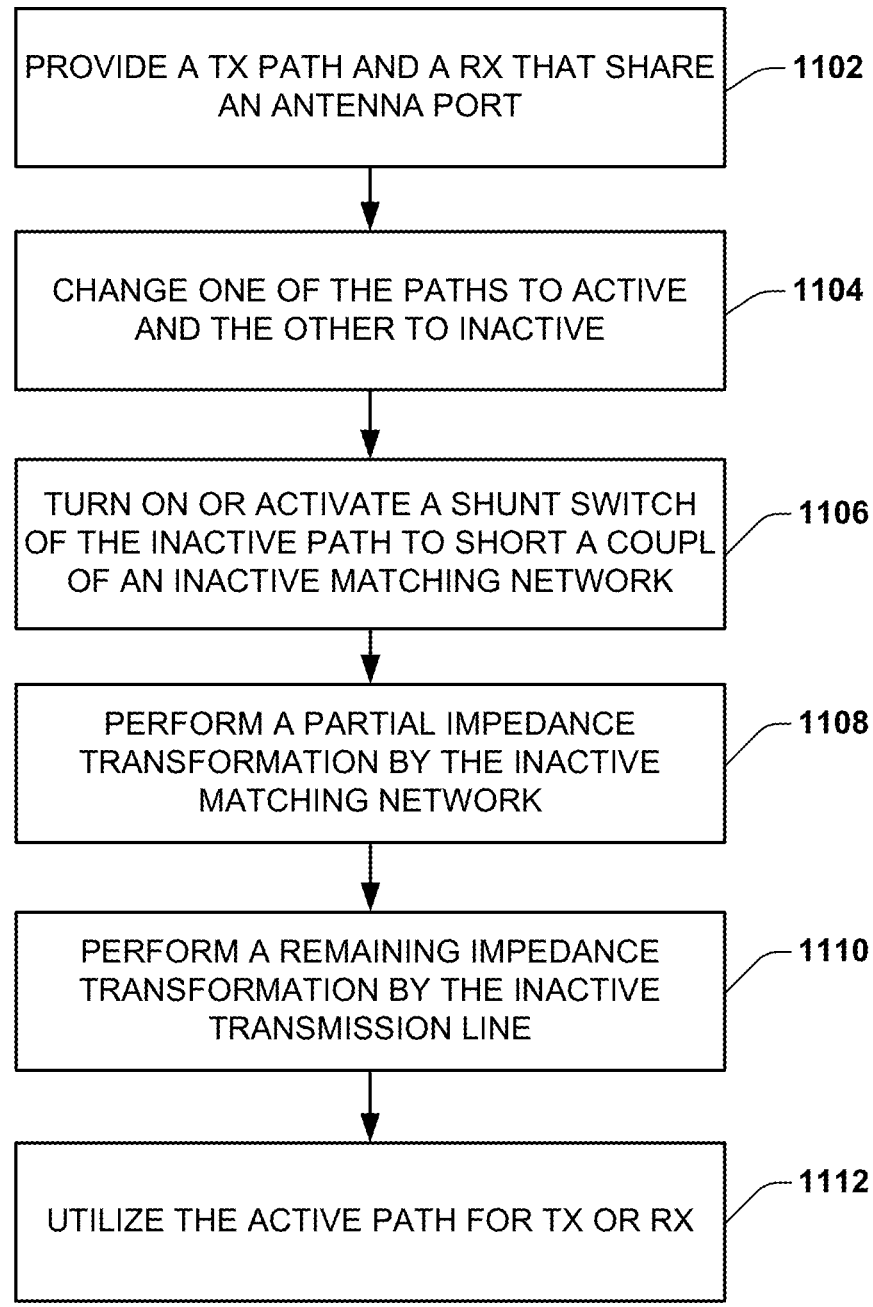
FIG. 11 is a flow diagram illustrating a method of operating a transmit receive switch (TRSW) system in accordance with some embodiments or aspects.

FIG. 11 is a flow diagram illustrating a method 1100 of operating a TRSW system in accordance with some embodiments or aspects. The method 1100 is provided for illustrative purposes and it is appreciated that suitable variations are contemplated.

The method 1100 can be performed with the above TRSW systems, such as the system 500 and the system 800. Further the method can be implemented using circuitry and/or processor, such as the front end module described above.

The method 1100 begins at block 1102, where a transmit (TX) path and a receive (RX) path are provided. The TX path and the RX path share an antenna port. Transmissions are generated by the TX path and signals are received by the RX path. Typically, one path is active while the other is inactive.

The TX path generally includes a power amplifier (PA), a TX shunt switch, a transformer based TX matching network and TX transmission line. The RX path generally includes a RX transmission line, a transformer based RX matching network, a RX shunt switch and a low noise amplifier (LNA). It is appreciated that the shunt switch(es) can be integrated into the amplifier(s).

One of the paths is changed to inactive mode and the other is changed to active mode at block 1104. For example, to transmit a signal, the TX path is changed to active while the RX path is changed or set to inactive. To receive a signal, the TX path is changed or set to inactive while the RX path is changed or set to active.

A shunt switch of the inactive path is activated or turned ON at block 1106. A shunt switch of the active path is opened or turned OFF. The ON switch creates a short across a coil of the inactive matching network and the OFF switch does not. Circuitry or logic, such as the circuitry 826, can be configured to turn ON and OFF the switches.

The inactive transformer based matching network performs a partial impedance transformation at block 1108 due to the ON shunt switch. An example of the partial impedance transformation is described above with regard to FIG. 7.

The inactive transmission line performed a remaining impedance transformation at block 1110. The combined impedance of the partial impedance transformation and the remaining impedance transformation is typically 180 degrees and/or λ/4. The remaining impedance is less than 180 degree and/or λ/4, thus the transmission lines are less than λ/4 and have a reduced length.

The active path performs transmission or reception at block 1112 while the inactive path is presented as an open circuit or near open circuit.

The method 1100 permits a reduced length of the transmission lines, which can also mitigate insertion loss, decrease die area used and the like.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, nonvolatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a transmit receive switch (TRSW) system having a transmission line, a transformer based matching network, a shunt switch, an amplifier and control circuitry. The transmission line is connected to an antenna port. The transformer based matching network is connected to the transmission line and has a first coil and a second coil, wherein the second coil is connected to the transmission line. The shunt switch is connected to the first coil of the transformer based matching network. The amplifier is connected to the shunt switch and the transformer matching network. The control circuitry is configured to cause the shunt switch to be ON during an inactive mode and create a short across the first coil.

Example 2 includes the subject matter of Example 1, including or omitting optional elements, wherein the transformer based matching network provides a partial impedance transformation during the inactive mode.

Example 3 includes the subject matter of any of Examples 1-2, including or omitting optional elements, wherein the transmission line has a length of less than $\lambda/4$.

Example 4 includes the subject matter of any of Examples 1-3, including or omitting optional elements, wherein the transmission line and the transformer based matching network provide a combined impedance transformation of 180 degrees of $\lambda/4$.

Example 5 includes the subject matter of any of Examples 1-4, including or omitting optional elements, wherein the amplifier is inactive during the inactive mode and active during an active mode.

Example 6 includes the subject matter of any of Examples 1-5, including or omitting optional elements, wherein the amplifier is configured to operate as the shunt switch.

Example 7 includes the subject matter of any of Examples 1-6, including or omitting optional elements, wherein the circuitry causes a drain of the amplifier to be connected to ground and a gate of the amplifier to be connected to a supply voltage during the inactive mode.

Example 8 includes the subject matter of any of Examples 1-7, including or omitting optional elements, wherein the circuitry causes a drain of the amplifier to be connected to a supply voltage and a gate of the amplifier to be connected to a bias voltage during an active mode.

Example 9 includes the subject matter of any of Examples 1-8, including or omitting optional elements, wherein the transmission line, the transformer based matching network, and the amplifier are part of a receive (RX) path.

Example 10 includes the subject matter of any of Examples 1-9, including or omitting optional elements, wherein the transmission line, the transformer based matching network and the amplifier are part of a transmit (TX) path.

Example 11 is a transmit receive switch (TRSW) system comprising a receive (RX) path and a transmit (TX) path. The RX path comprises a RX transmission line coupled to an antenna port, a RX transformer based matching network connected to the RX transmission line, a RX shunt switch connected to the RX transformer based matching network, and a low noise amplifier (LNA) connected to the RX shunt switch and the RX transformer based matching network. The TX path comprises a TX transmission line coupled to the antenna port, a TX transformer based matching network connected to the TX transmission line, a TX power amplifier configured to operate as a TX shunt switch in an inactive mode is connected to the TX transformer based matching network.

Example 12 includes the subject matter of Example 11, including or omitting optional elements, wherein one of the RX path and the TX path is active mode while the other is inactive mode.

Example 13 includes the subject matter of any of Examples 11-12, including or omitting optional elements, wherein the TX transmission line has a transmission length less than $\lambda/4$ and the RX transmission line has a transmission length less than $\lambda/4$.

Example 14 includes the subject matter of any of Examples 11-13, including or omitting optional elements, wherein the RX shunt switch is open upon the RX path being active and is closed upon the RX path being in the inactive mode.

Example 15 includes the subject matter of any of Examples 11-14, including or omitting optional elements, wherein the RX shunt switch is ON or closed upon the RX path being inactive and the RX shunt switch being ON causes a short across a second coil of the RX transformer based matching network.

Example 16 includes the subject matter of any of Examples 11-15, including or omitting optional elements, wherein the TX shunt switch is part of the PA.

Example 17 includes the subject matter of any of Examples 11-16, including or omitting optional elements, further comprising control circuitry configured to set a drain of the PA to a supply voltage and a gate of the PA to a bias voltage upon the TX path being in an active mode.

Example 18 includes the subject matter of any of Examples 11-17, including or omitting optional elements, further comprising control circuitry configured to set a drain of the PA to a ground and a gate of the PA to a supply voltage upon the TX path being in an inactive mode.

Example 19 is a method of operating a transmit receive switch (TRSW). The method includes setting a path of a transceiver to an inactive mode; controlling a shunt switch to create a short via a first coil of an inactive transformer based matching network; performing a partial impedance transformation by the transformer based matching network for the inactive path or path; and performing a remaining impedance transformation by a transmission line for the inactive path or path.

Example 20 includes the subject matter of Example 19, including or omitting optional elements, the partial impedance transformation and the remaining impedance transformation combine to equal 180 degrees.

Example 21 includes the subject matter of any of Examples 19-20, including or omitting optional elements, further comprising setting a second path of the transceiver to active and transmitting a signal or receiving a signal via the second path.

Example 22 includes the subject matter of any of Examples 19-21, including or omitting optional elements, wherein the path is a transmit path and the second path is a receive path.

Example 23 includes the subject matter of any of Examples 19-22, including or omitting optional elements, wherein the path is a receive path and the second path is a transmit path.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A transmit receive switch (TRSW) system comprising:
a transformer based matching network connected to a transmission line and having a first coil and a second coil, wherein the second coil is connected to the transmission line;
a shunt switch connected to the first coil of the transformer based matching network; and
control circuitry configured to cause the shunt switch to be ON and create a low impedance short across the first coil of the transformer during an inactive mode.

2. The system of claim 1, wherein the transformer based matching network provides a partial impedance transformation during the inactive mode.

3. The system of claim 1, wherein the transmission line has a length of less than $\lambda/4$ and provides a remaining impedance transformation during the inactive mode.

4. The system of claim 3, wherein the transmission line and the transformer based matching network provide a combined impedance transformation of 180 degrees of $\lambda/4$.

5. The system of claim 1, further comprising an amplifier connected to the shunt switch and the transformer based matching network, wherein the amplifier is inactive during the inactive mode and active during an active mode.

6. The system of claim 1, further comprising an amplifier connected to the shunt switch and the transformer based matching network, wherein the amplifier is configured to operate as the shunt switch.

7. The system of claim 1, wherein the circuitry causes a drain of an amplifier to be connected to ground and a gate of the amplifier to be connected to a supply voltage during the inactive mode.

8. The system of claim 1, wherein the circuitry causes a drain of an amplifier to be connected to a supply voltage and a gate of the amplifier to be connected to a bias voltage during an active mode.

9. The system of claim 1, wherein the transmission line, the transformer based matching network, and an amplifier are part of a receive (RX) path.

10. The system of claim 1, wherein the transmission line, the transformer based matching network and an amplifier are part of a transmit (TX) path.

11. A method of operating a transmit receive switch (TRSW), the method comprising:
    setting a path of a transceiver to an inactive mode;
    controlling a shunt switch to create a low impedance short across a first coil of an inactive transformer based matching network, wherein the low impedance short is greater than zero ohm;
    performing a partial impedance transformation by the inactive transformer based matching network for the inactive path based on the low impedance short; and
    performing a remaining impedance transformation by a transmission line for the inactive path.

12. The method of claim 11, wherein the partial impedance transformation and the remaining impedance transformation combine to equal 180 degrees.

13. The method of claim 11, further comprising setting a second path of the transceiver to active and transmitting a signal or receiving a signal via the second path.

14. The system of claim 1, wherein the low impedance short is a matching impedance.

* * * * *